(12) United States Patent
Haddad et al.

(10) Patent No.: US 6,513,086 B1
(45) Date of Patent: Jan. 28, 2003

(54) SIGNAL CONDITIONING SYSTEM INCLUDING LOW VOLTAGE AND HIGH VOLTAGE ANALOG BUSES

(75) Inventors: Michel Haddad, Austin, TX (US); Alvin G. Becker, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 09/447,514

(22) Filed: Nov. 23, 1999

(51) Int. Cl.[7] .................................................. G06F 1/00
(52) U.S. Cl. ..................... 710/305; 713/330; 713/340; 710/301; 361/191
(58) Field of Search ................................ 713/330, 340; 710/301–304, 305, 313, 105, 106, 110; 361/368, 160, 167, 168, 190, 191–192

(56) References Cited

U.S. PATENT DOCUMENTS

| | | | | |
|---|---|---|---|---|
| 4,697,858 A | * | 10/1987 | Balakrishnan | 439/61 |
| 5,124,638 A | | 6/1992 | Winroth | |
| 5,751,536 A | * | 5/1998 | Haddad et al. | 361/191 |
| 5,764,927 A | * | 6/1998 | Murphy et al. | 710/115 |
| 5,958,056 A | * | 9/1999 | Lehmann | 713/310 |
| 6,067,584 A | * | 5/2000 | Hayles et al. | 710/10 |
| 6,351,715 B1 | * | 2/2002 | Ykema | 702/62 |

OTHER PUBLICATIONS

Instrumentation Catalogue 1998, National Instruments, pp. 322–338.
Data Acquisition Seminar, National Instruments, Jan. 1995 Edition, pp. 45–61.

* cited by examiner

*Primary Examiner*—Xuan M. Thai
*Assistant Examiner*—Raymond N Phan
(74) *Attorney, Agent, or Firm*—Jeffrey C. Hood

(57) ABSTRACT

A signal conditioning system which includes a low voltage analog bus and a high voltage analog bus. The signal conditioning system comprises a chassis having a plurality of slots, wherein each of the slots is adapted to receive a module. The chassis includes a low voltage analog bus and adapted for transmitting low voltage electrical signals. The chassis also includes a high voltage analog bus and adapted for transmitting high voltage electrical signals. Modules may be placed in slots of the chassis, wherein each module may connect through a connector to one or both of the low voltage analog bus and the high voltage analog bus. The high voltage analog bus allows for the conditioning (including switching) of high voltage electrical signals. In an alternate embodiment, the signal conditioning system may comprise a chassis which only includes a low voltage analog bus, i.e., the chassis does not include a built-in high voltage analog bus. For example the signal conditioning system may be an existing SCXI chassis which does not include a high voltage analog bus. In this embodiment, the system may include one or more rear connectors which are adapted to connect to one or more of the modules comprised in the chassis. The one or more rear connectors collectively form a high voltage analog bus for transmitting high voltage electrical signals between the one or more modules.

21 Claims, 9 Drawing Sheets

SIGNAL CONDITIONING SYSTEM INCLUDING LOW VOLTAGE AND HIGH VOLTAGE ANALOG BUSES

FIELD OF THE INVENTION

The invention relates to test and measurement and data acquisition systems, and more particularly to signal conditioning and switching systems and circuitry for conditioning and routing signals.

DESCRIPTION OF THE RELATED ART

Scientists and engineers often use test and measurement and data acquisition systems to perform a variety of functions, including laboratory research, process monitoring and control, data logging, analytical chemistry, test and analysis of physical phenomena and control of mechanical or electrical machinery, to name a few examples. One example of hardware to implement such measuring systems is a computer-based measurement system or data acquisition (DAQ) system. A computer-based measurement or DAQ system typically includes transducers for measuring and providing electrical signals, signal conditioning hardware which may perform amplification, isolation and/or filtering, and measurement or DAQ hardware for receiving digital and analog signals and providing them to a processing system, such as a personal computer. The computer may further include analysis hardware and software for analyzing and appropriately displaying the measured data.

As mentioned above, a measurement system may include one or more of a measurement or DAQ device comprised in or connected to a computer system. The device may be an I/O board plugged into one of the I/O slots of the processing or computer system. The measurement or DAQ device may also comprise an external device connected to a computer system. Exemplary hardware I/O (input/output) interface options include the GPIB (general purpose interface bus), the VXI bus, the PXI bus, or a serial bus such as the RS-232 protocol, IEEE 1394, or USB.

PC based measurement and data acquisition systems are used in a wide range of applications in the laboratory, in the field, and on the manufacturing plant floor. Typically, measurement or DAQ devices, such as DAQ plug-in boards, are general purpose data acquisition instruments that are well suited for measuring voltage signals. However, most real world sensors and transducers generate signals that must be conditioned before a measurement or DAQ device can reliably and accurately acquire the signal. This front-end processing is referred to as signal conditioning. Most PC based measurement and DAQ systems include some form of signal conditioning in addition to the measurement or DAQ device, usually a DAQ plug-in board in a personal computer.

Signal conditioning includes functions such as signal amplification, filtering, electrical isolation, linearization, transducer excitation, switching and multiplexing. Amplification is one of the most common types of signal conditioning. For example, low level thermocouple signals typically must be amplified to increase their resolution. Transducer excitation refers to signal conditioning hardware creating excitation for certain transducers such as strain gauges and RTDs, which require external excitation voltages or currents. Signal conditioning hardware also may linearize voltage levels from transducers so that a simple scaling function can convert the voltage to the measured phenomena. Isolation is another common use for signal conditioning hardware in order to isolate the transducer signals from the computer for safety purposes. The unit under test or device being monitored may contain high voltage transients that can damage the computer or harm the operator. Isolation is used to remove the possibility of these large voltage spikes affecting the computer. Filtering involves the signal conditioning hardware filtering unwanted signals. For example, the signal conditioning peripherals can contain low pass filters that eliminate high frequencies that can produce erroneous data. A common use of a low pass filter is one that filters out the 60 Hz AC power line noise present in most laboratories and factories.

As mentioned above, signal conditioning systems may also perform a switching or multiplexing function. Front-end switching systems increase the functionality of the measurement and automation system. General purpose switching delivers digital control of the presence or absence of a signal in the system. Multiplexers/matrix relay configurations control source and signal routing for the system, as well as act as a multiplexing front end for devices such as digital multimeters.

There are various types or classes of signal conditioning hardware. For example, the signal conditioning circuitry may be comprised directly on the measurement device or data acquisition device or board. This has advantages of lower cost and a requirement of less physical space. However, this also has numerous disadvantages such as no isolation of signals, low channel count, inability to perform distributed or remote I/O, and a lack of modularity, possibly requiring a different board for each type of transducer.

An alternative method for performing signal conditioning involves a direct connect modular system which may include a signal conditioning module for each channel. A direct connect modular system typically comprises a two port system that receives unconditioned signals on one port and sends out the conditioned signals on a second port to a measurement or DAQ device or board in the computer system. An advantage of this system is that the signals are conditioned outside of the noisy computer environment. Also, the system provides modularity, and developers can configure each channel for different transducer types. However, this two-port system generally cannot perform distributed or remote I/O and has a low channel count.

National Instruments Corporation developed a signal conditioning system referred to as Signal Conditioning eXtensions for Instrumentation (SCXI), which is a high-performance multi-channel signal conditioning front end system for PC based measurement devices and DAQ boards. An SCXI system comprises a rugged low noise external chassis that houses signal conditioning modules for amplifying, multiplexing and isolating field signals. SCXI modules are inserted into the SCXI chassis and perform various signal conditioning functions. The SCXI modules are fully shielded signal conditioning circuit boards that plug directly into the SCXI backplane/power bus. The SCXI includes guarded analog and digital buses and complete shielding and thus is able to handle sensitive analog measurements. As a result, when it is desirable to connect high level amplified signals to the noisy PC environment, transducer leads and signals are connected to shielded terminal blocks that plug directly on to signal conditioning modules.

The SCXI system expanded prior art external signal conditioning systems from a two port configuration to a three port configuration. The third port in the SCXI system is a bus backplane with a guarded analog bus, digital control, timing signals, and trigger signals. The bus backplane solves the low channel count limitation because the system can multiplex thousands of signals on to the analog bus. The conditioned signals may then be connected to the measurement device or DAQ board, which digitizes the conditioned signals. The third port also makes the SCXI system more flexible than a two port system because the user can plug modules such as digitizers into the bus and use the system for distributed I/O.

An SCXI system is designed to work with a wide range of applications and in a wide range of industries. An SCXI system is especially good for large channel count production or industrial test or automation systems that require a variety of transducers and signal types. SCXI modules can be easily reconfigured for separate types of signals or transducers, including thermocouples, RTDs, strain gauges, various filtering sources, current sources, and digital signals.

However, current signals conditioning systems, such as the SCXI signal conditioning system, lack the ability to switch high voltage analog signals. This limits the ability of the signal conditioning system with respect to high voltage signals. Therefore, an improved signal conditioning and switching system is desired which provides high voltage signal conditioning capabilities, including switching and multiplexing capabilities.

SUMMARY OF THE INVENTION

The present invention comprises a signal conditioning system and switching which includes a high voltage analog bus according to the present invention. The signal conditioning system comprises a chassis having a plurality of slots, wherein each of the slots is adapted to receive a module. The module may be a signal conditioning module, including a switching module, or an instrument module.

The chassis includes a low voltage analog bus (or backplane) comprised in the chassis and adapted for transmitting low voltage electrical signals. The low voltage analog bus includes one or more analog channels and is preferably the SCXI backplane. The chassis also includes a high voltage analog bus (or backplane) comprised in the chassis and adapted for transmitting high voltage electrical signals. The high voltage analog bus allows for the conditioning (including switching) of high voltage electrical signals.

The chassis further includes a plurality of connectors positioned in the chassis and electrically coupled to one or more of the low voltage analog bus and the high voltage analog bus. Each connector is adapted to connect a module to one or more of the low voltage analog bus and the high voltage analog bus. Thus, modules may be placed in slots of the chassis, wherein each module may connect to one or both of the low voltage analog bus and the high voltage analog bus.

In one embodiment, the plurality of connectors includes a plurality of low voltage connectors adapted to connect a module to the low voltage analog bus and a plurality of high voltage connectors adapted to connect a module to the high voltage analog bus. Each module may have one or more corresponding or mating connectors for connecting to one or both of the low voltage analog bus and the high voltage analog bus. Thus the signal conditioning system may include a low voltage module comprised in a slot of the chassis which connects through a low voltage connector to the low voltage analog bus. In a similar manner, the signal conditioning system may include a high voltage module comprised in a slot of the chassis which connects through a high voltage connector to the high voltage analog bus. The signal conditioning system may further include a safety switch, e.g., comprised on an instrument module, which is software programmable to connect a module to either the low voltage analog bus or the high voltage analog bus. In an alternate embodiment, a slot of the chassis may include only a low voltage connector for connecting a module to only the low voltage analog bus in that slot, and/or a slot of the chassis may include only a high voltage connector for connecting a module to only the high voltage analog bus in the respective slot.

The signal conditioning system may further have an external connector comprised on the chassis which is electrically connected to one or more of the low voltage analog bus and the high voltage analog bus. The external connector may be adapted to connect to an external instrument. Thus an external instrument may connect through the external connector to one or both of the low voltage analog bus and the high voltage analog bus.

In one embodiment, a module may include an instrument connector, preferably on the front of the module. When the module is inserted into a slot of the chassis, the instrument connector on the module may be used to connect an external instrument through the module to one or both of the low voltage analog bus and the high voltage analog bus. The chassis may also include an external connector which may electrically connect to a module inserted into a slot of the chassis, e.g., an instrument module, wherein the external connector is adapted for connecting the module to one or both of the low voltage analog bus and the high voltage analog bus.

In an alternate embodiment of the invention, the signal conditioning system may comprise a chassis which only includes a low voltage analog bus, i.e., the chassis does not include a built-in high voltage analog bus. For example the signal conditioning system may be an existing SCXI chassis which does not include a high voltage analog bus. In this embodiment, the system may include one or more rear connectors which are adapted to connect to one or more of the modules comprised in the chassis. The one or more rear connectors form a high voltage analog bus for transmitting high voltage electrical signals between the one or more modules.

BRIEF DESCRIPTION OF THE DRAWINGS

A better understanding of the present invention can be obtained when the following detailed description of the preferred embodiment is considered in conjunction with the following drawings, in which.

Figure 1:
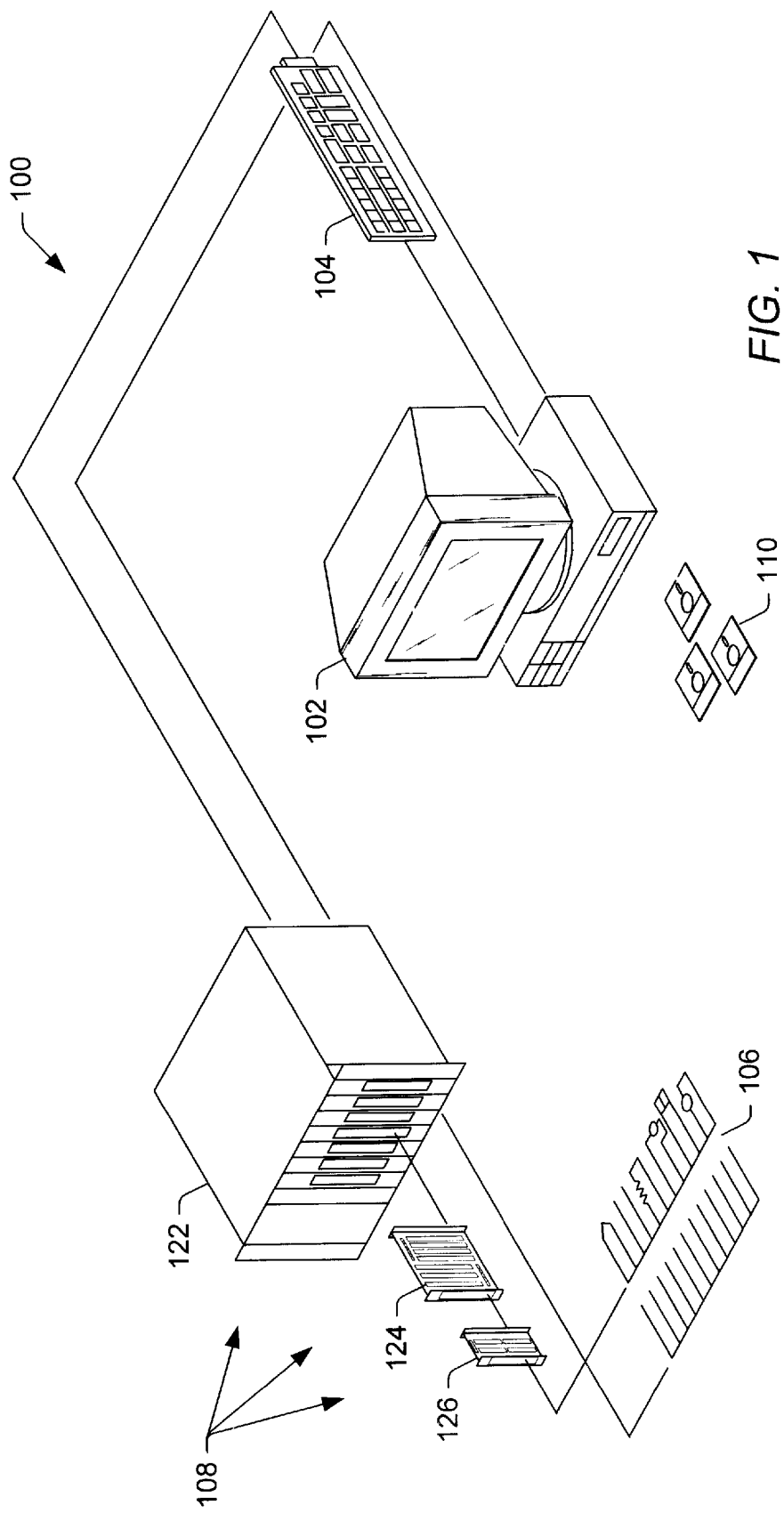
FIG. 1 illustrates an instrumentation system which includes the signal conditioning system of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

FIG. 1—Instrumentation System

FIG. 1 illustrates an exemplary measurement or data acquisition (DAQ) system 100 according to one embodiment of the present invention. The system 100 comprises a computer 102, a DAQ or measurement device 104 coupled to the computer 102, a signal conditioning and switching system 108 (hereafter referred to as signal conditioning systems 108) coupled to the DAQ device 104, and transducers 106 or other detecting means which provide field electrical signals to the DAQ device 104 through the signal conditioning circuitry 108.

The computer 102 may include various standard components, including at least one central processing unit (CPU), non-volatile memory, system memory, a hard drive, one or more buses, and a power supply. The device 104 may be a data acquisition (DAQ) device or an instrumentation device, such as a scope, DMM (digital multimeter), arbitrary waveform generator, or other type of device. The embodiment described below presumes the presence of a DAQ device.

In one embodiment, the computer 102 comprises input/output (I/O) slots into which the DAQ device 104 is coupled. In another embodiment, the computer 102 comprises a VXI (VME Extensions for Instrumentation) chassis and bus, a GPIB (General Purpose Interface Bus), a serial port or parallel port by which the DAQ device 104 is coupled to the computer 102.

The transducers 106 and other detecting means provide the field signals representing a process, physical phenomena, equipment being monitored or measured, etc. to the DAQ device 104. Examples of the transducers 106 are strain gauges, thermocouples, thermistors, photoconductive cells, microphones, and piezoelectric transducers, among others.

Figure 5:
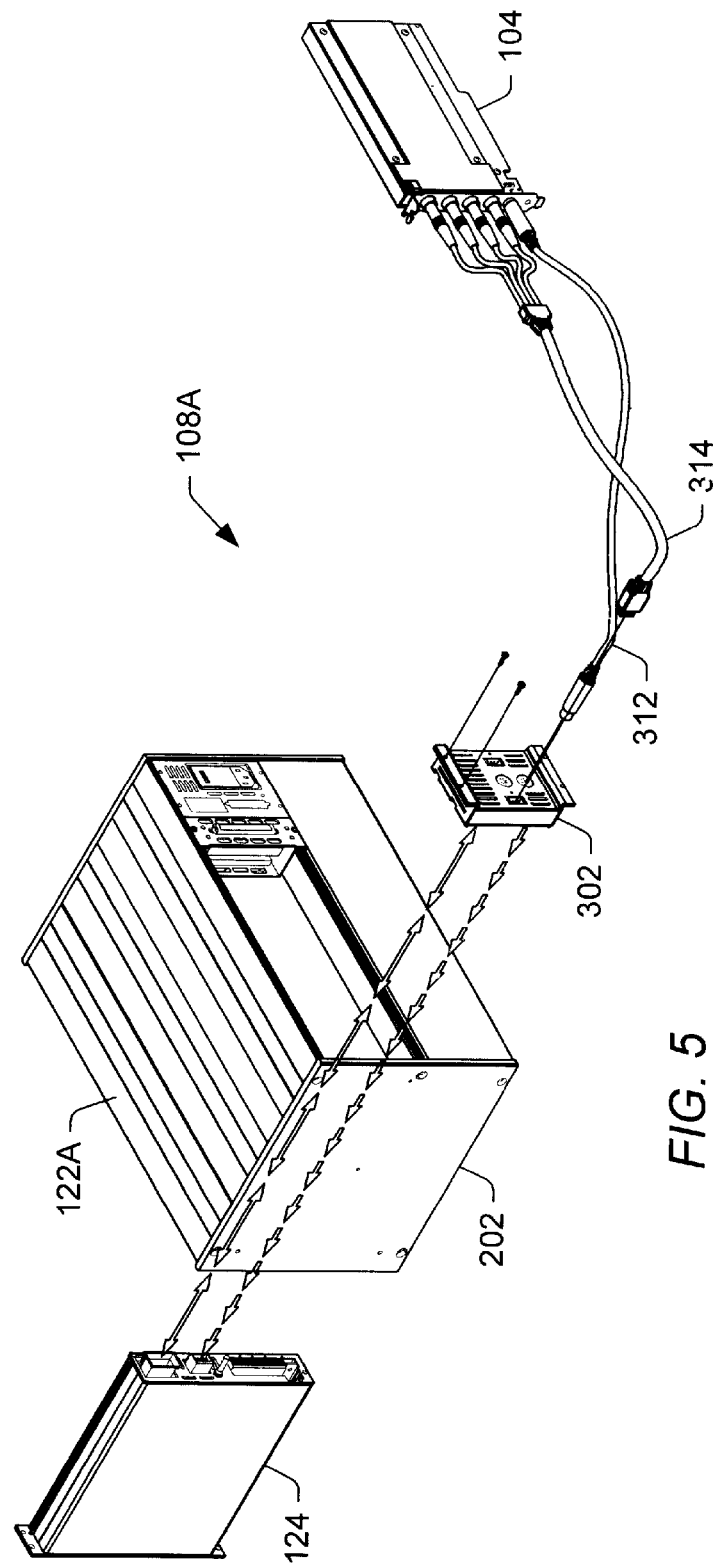
FIG. 5 illustrates a signal conditioning system according to an alternate embodiment, wherein one or more rear connectors are used to create the high voltage analog bus.
Figure 6:
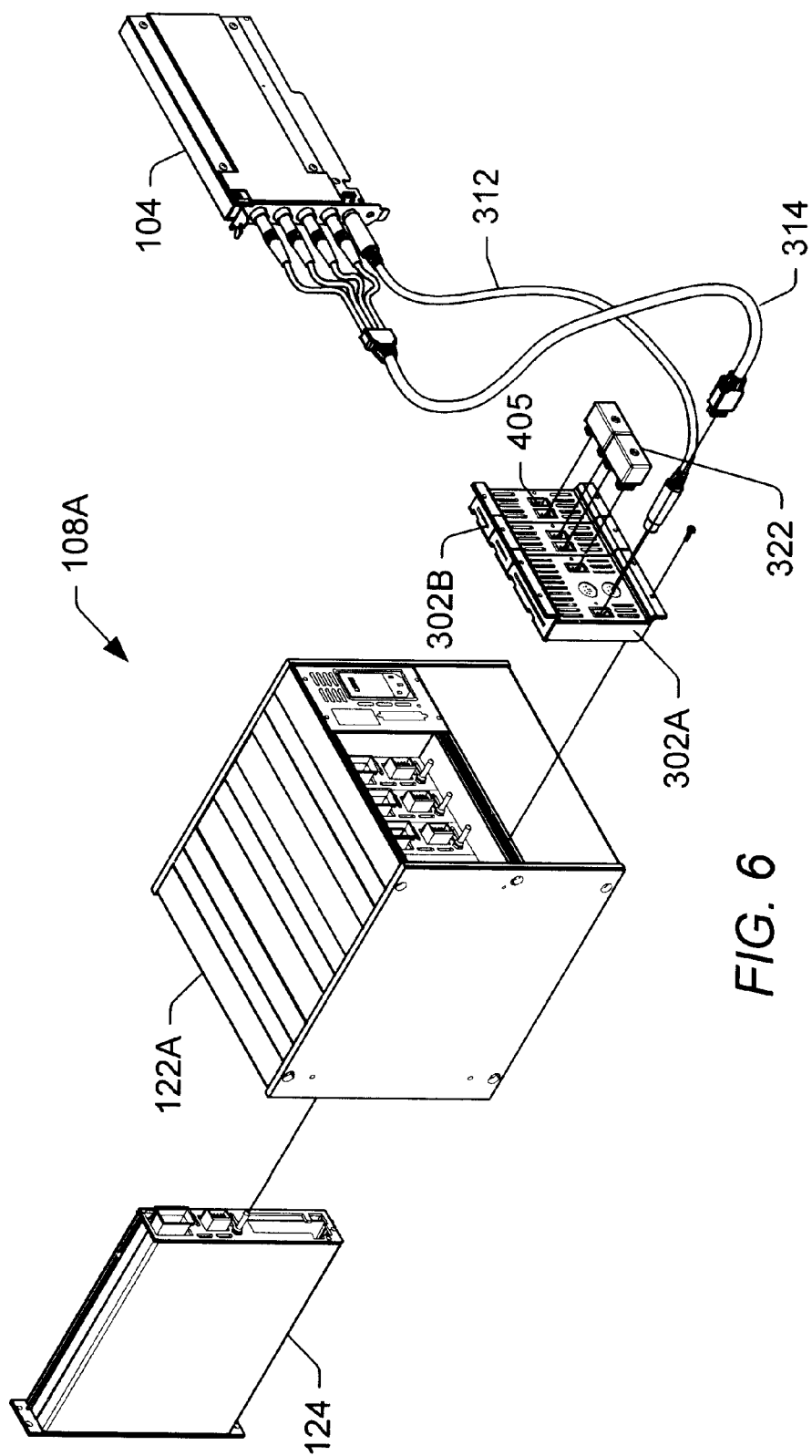
FIG. 6 illustrates an embodiment of the signal conditioning system of FIG. 5, including a plurality of rear connectors used to create the high voltage analog bus.

The signals received by the transducers 106 are conditioned by the signal conditioning system 108 according to the present invention. The conditioned signals may then be provided to the DAQ device 104 as shown. The signal conditioning system 108 may connect to the DAQ device 104 via one or more cables. In the preferred embodiment, the signal conditioning system 108 connects to the DAQ device 104 via two cables, where on cable transmits digital control signals, and the second cable transmits analog signals (FIGS. 5 and 6).

The signal conditioning system 108 comprises an improved signal conditioning system which includes a low voltage analog bus and a high voltage analog bus according to the present invention. The signal conditioning system 108 is preferably based on the Signal Conditioning Extensions for Instrumentation (SCXI) system and includes a high voltage analog bus according to the present invention. SCXI is an open architecture, multi-channel signal conditioning front-end system for DAQ devices.

The signal conditioning system 108 comprises an external chassis 122 housing one or more signal conditioning modules 124 and optionally terminal blocks 126. The signal conditioning system 108 may be used to perform signal conditioning on signals. As used herein, the term "signal conditioning" includes amplifying, multiplexing, linearizing, isolating, filtering, switching and/or multiplexing field signals, as well as transducer excitation, among other signal functions. The signal conditioning system 108 may advantageously reduce the introduction of noise into the signals transmitted to the DAQ device 104.

Figure 2:
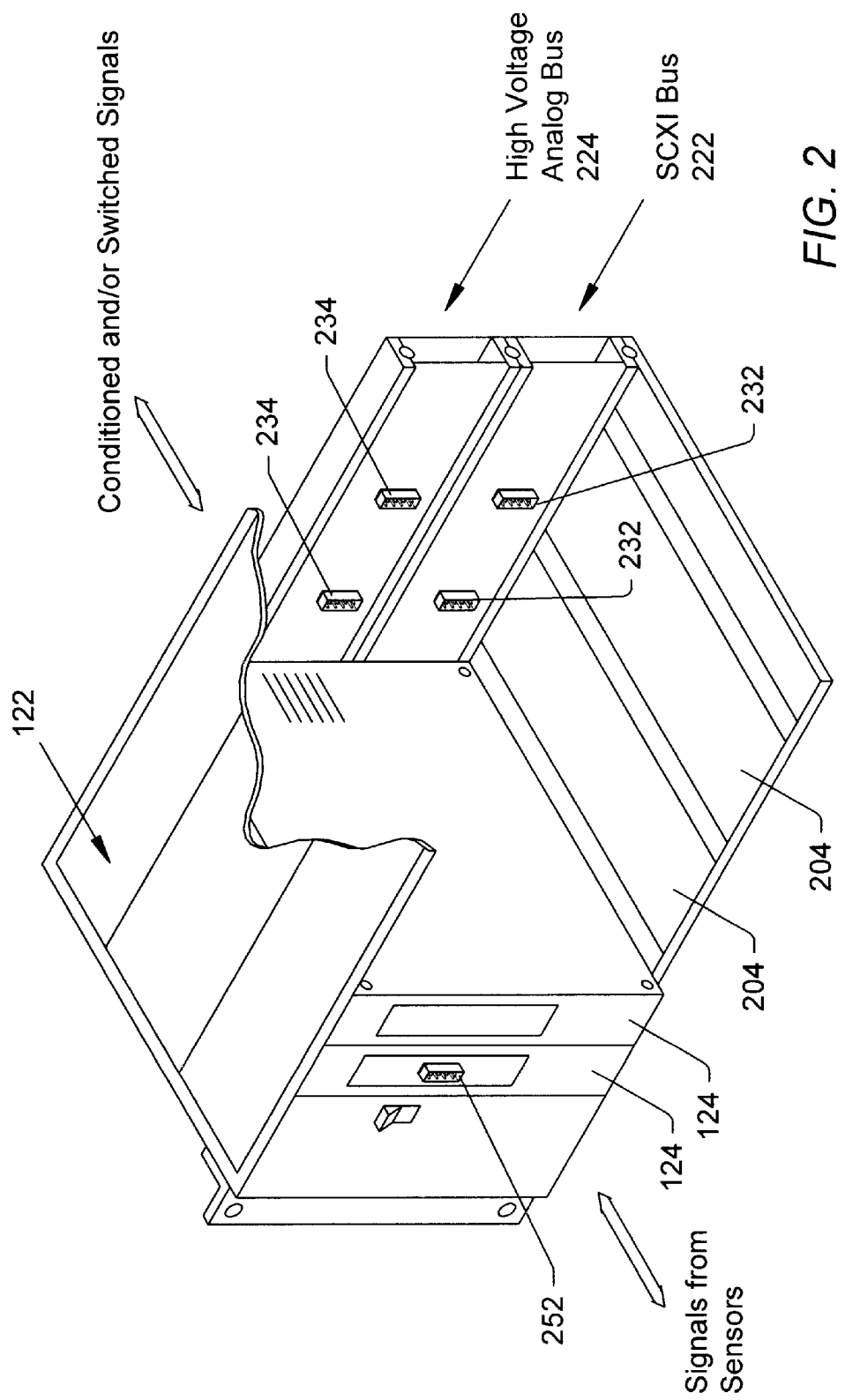
FIG. 2 is a cut-away block diagram illustrating one embodiment of the signal conditioning system of FIG. 1.

FIG. 2—Signal Conditioning System

FIG. 2 is a cutaway drawing of a signal conditioning system 108 according to one embodiment of the present invention. As shown, the signal conditioning system 108 includes a chassis 122. In the embodiment of FIG. 2, a high voltage analog bus according to the present invention is comprised in the chassis 122. The chassis 122 includes slots 204, i.e., is configured to define a plurality of slots, where each of the slots is adapted to receive a module. The modules may be signal conditioning modules, including switching modules, and/or instrument modules. Signal conditioning modules may perform various functionality such as filtering, isolation, linearization, multiplexing or other types of signal conditioning. Switching modules (which are also considered to be signal conditioning modules) may perform functionality such as switching or multiplexing. Instrument modules may implement various types of instrumentation, e.g., test or measurement, functionality, such as a scope, DMM, analog to digital conversion, etc. Two modules 124 are shown inserted into the chassis 122, as shown.

The chassis 122 includes a first backplane 222, which may be referred to as the low voltage analog bus (or low voltage analog backplane) 222, that is used for low voltage analog signals. The low voltage analog bus 222 is preferably an SCXI backplane. The low voltage analog bus 222 is adapted for transmitting low voltage electrical signals and may include one or more analog channels. For more information on the SCXI backplane, please see technical briefs available from National Instruments Corporation.

The chassis 122 also includes a second backplane 224, referred to as the high voltage analog bus (or high voltage analog backplane) 224, which is used for transmission of high voltage analog signals. The high voltage analog bus 224 comprises an independent backplane separate from the first bus 222. As used herein, the term "high voltage" includes signals having voltages greater than 10 volts peak to peak. The term "high voltage" may also be defined as signals having voltages greater than 42 voltages peak to peak, or voltages greater than 60 volts DC, or voltages greater than 30 volts rms and 42.4 volts peak.

The signal conditioning system 108 includes a "first port" comprising signal conditioning module connectors used for receiving signals from sensors or transducers. The signal conditioning system 108 includes a "second port" comprising connectors for providing conditioned signals to the computer system 102. The low voltage analog bus 222 effectively provides a third port for the conduction of analog signals on the low voltage analog bus 222. The high voltage analog bus 224 effectively provides a fourth port for the conduction of analog signals on the high voltage analog bus 224. Thus the signal conditioning system 108 may be described as a four port device.

The signal conditioning system 108 also includes a plurality of connectors 230 positioned in the chassis 122 and electrically coupled to one or more of the low voltage analog bus 222 and the high voltage analog bus 224. Each connector is adapted to connect a module to one or more of the low voltage analog bus 222 and the high voltage analog bus 224.

In the preferred embodiment, the plurality of connectors 230 include a plurality of low voltage connectors 232 and a plurality of high voltage connectors 234. Each of the low voltage connectors 232 is adapted to connect a module to the low voltage analog bus 222, and each of the high voltage connectors 234 is adapted to connect a module to the high voltage analog bus 224. In an alternate embodiment, the signal conditioning system 108 may include a slot having only a low voltage connector, wherein the respective slot may only be used to connect a module to the low voltage analog bus 222. In a similar manner, the signal conditioning system 108 may include a slot having only a high voltage connector, wherein the respective slot may only be used to connect a module to the high voltage analog bus 224.

The signal conditioning system 108 may further include one or more modules each comprised in slots of the chassis. As noted above, the modules may be one or more of signal conditioning modules (including switching modules), or instrument modules. At least one module 124 may connect through one of the connectors to one or more of the low voltage analog bus backplane 222 and the high voltage analog bus backplane 224. A module 124 may connect through the low voltage connector 232 to the low voltage analog bus 222, or a module 124 may connect through a high voltage connector 232 to the high voltage analog bus backplane 224.

Thus, in one embodiment, a low voltage module may be comprised in a slot of the chassis 122, wherein the low voltage module connects to a low voltage connector 232. The low voltage module connects through the low voltage connector 232 to the low voltage analog bus 222. In a similar manner, a high voltage module may also, or instead, be comprised in a slot of the chassis 122, wherein the high voltage module connects to a high voltage connector 234. The high voltage module connects through the high voltage connector 234 to the high voltage analog bus 224.

The signal conditioning system 108 may also include a safety switch, which may be comprised on an instrumentation module. The safety switch is programmable to connect a module to either the low voltage analog bus 222 or the high voltage analog bus 224. For more information on one embodiment of the safety switch, please see U.S. Pat. No. 5,751,536 titled "Method and Apparatus for Providing Isolation from Hazardous Voltage Levels in a Hybrid Instrumentation System", which is hereby incorporated by reference.

The signal conditioning system 108 may further include an external connector (404, FIG. 4 or 405, FIGS. 6 and 7), preferably comprised on the outside of the chassis 122, which is electrically connected to one or more of the low voltage analog bus 222 and the high voltage analog bus 224. The external connector 404 or 405 may be electrically connected only to the high voltage analog bus 224 or may be electrically connected only to the low voltage analog bus 222. The external connector 405 may be adapted to connect to one or more external instruments. Thus the external connector 405 may be used to enable an external instrument to connect to one or both of the low voltage analog bus 222 and the high voltage analog bus 224. The external connector 404 may be used to connect a module 124, or an external instrument, to a respective bus 222 or 224.

In one embodiment, a module 124 may include an instrument connector 252 comprised on the front of the module 124. The instrument connector 252 may be adapted to connect an external instrument through the module 124 to one or more of the low voltage analog bus 222 and the high voltage analog bus 224.

The high voltage analog bus 224 may be used for various purposes. For example, the high voltage analog bus 214 may operate to expand the capabilities of two or more multiplexer/matrix modules for additional multiplexing or switching capabilities. In addition, the high voltage analog bus backplane 224 may be used to pass high voltage signals between two modules, e.g., two signal conditioning modules, a signal conditioning module and a switching module, a signal conditioning module and an instrument module, etc. In general, the high voltage analog bus 224 allows for signal conditioning, including switching, of high voltage signals in the signal conditioning system 108.

The high voltage analog bus can accommodate high voltage (e.g., 250 Vrms) without compromising the integrity of the chassis 122.

Figure 3:
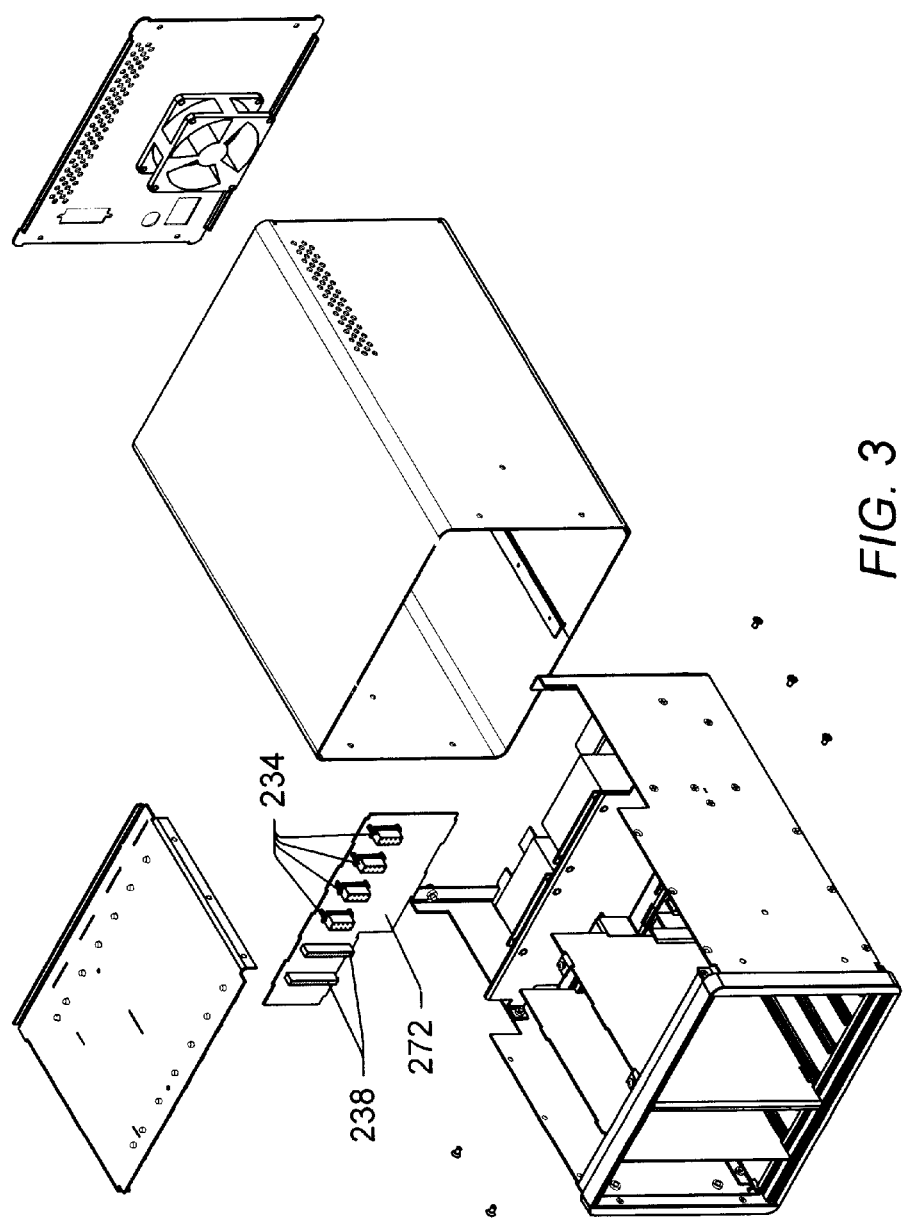
FIG. 3 is an exploded view of one embodiment of the signal conditioning system of FIG. 2.

FIG. 3 is an exploded view of one embodiment of the chassis 122 of FIG. 2. In FIG. 3, the low voltage analog bus 222 and corresponding low voltage connectors 232 are comprised in the chassis 122 and are not shown in the figure. In FIG. 3, the high voltage analog bus 224 and corresponding high voltage connectors 234 are comprised on card 272, as shown. Card 272 includes four high voltage connectors 234 as well as two instrument module connectors 238.

Figure 4:
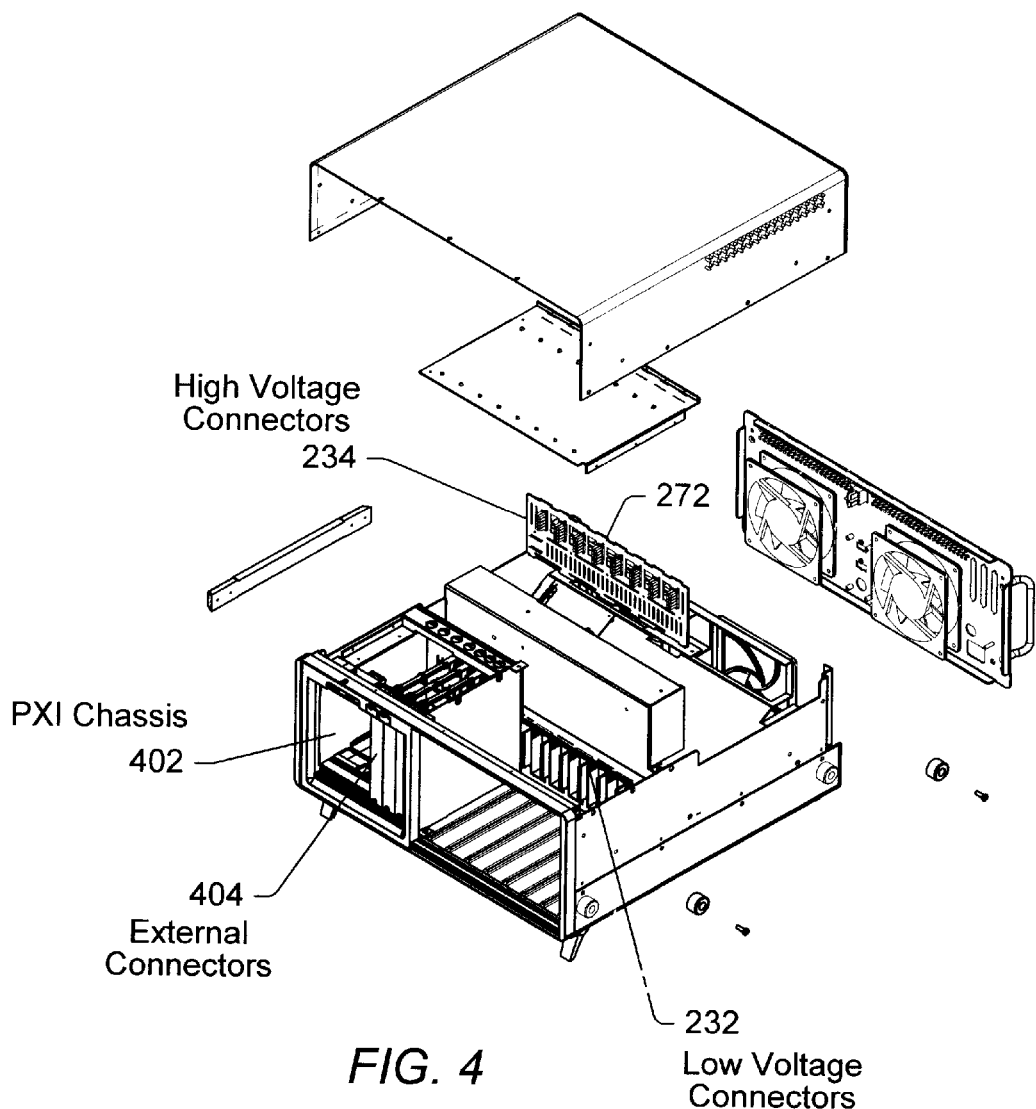
FIG. 4 is an exploded view of another embodiment of the signal conditioning system of FIG. 2.

FIG. 4 is an exploded view of another embodiment of the signal conditioning system of FIG. 2. FIG. 4 shows a PXI chassis 402 comprised in a chassis 122 according to the present invention. The PXI chassis 402 is adapted for receiving PXI cards or modules. As shown, the chassis 122 includes low voltage connectors 232. In FIG. 4, the high voltage analog bus 224 and corresponding high voltage connectors 234 are comprised on card 272, as shown.

The PXI chassis 402 and/or signal conditioning chassis 122 may include low voltage and high voltage external connectors 404 which connect to the low voltage analog bus 222 and the high voltage analog bus 224, respectively. A PXI module may have a corresponding connector which connects through a cable (not shown) to either of the low voltage and high voltage external connectors 404, thus enabling the PXI module to connect to one or both of the low voltage analog bus 222 and the high voltage analog bus 224. Alternatively, the external connectors 404 may be used for connecting another external device or instrument to one or both of the low voltage analog bus 222 and the high voltage analog bus 224.

FIG. 5—Implementation of the HVAB Using Rear Adapters

FIG. 5 illustrates an alternate embodiment of the present invention, wherein the high voltage analog bus is implemented using one or more rear adapters 302 connected to one or more signal conditioning modules 124. The one or more rear adapters 302 operate to create the high voltage analog bus 224 as an independent backplane separate from the low voltage analog bus 222, e.g., the SCXI bus. This embodiment may be used to create or implement the high voltage analog bus 224 as an independent backplane in existing signal conditioning systems, e.g., SCXI chassis systems, which did not include the high voltage analog bus. In other words, for existing signal conditioning systems, e.g., SCXI systems, in which the chassis does not include the high voltage analog bus 224 built into the chassis, the rear adapters 302 are inserted into the backs of modules to create the high voltage analog bus 224. The rear adapters 302 also allow for a more modular implementation of the high voltage analog bus 224.

In this system, as shown in FIG. 5, the signal conditioning system 108A includes a chassis 122A. The chassis 122A is configured to define a plurality of slots, wherein each of the slots is adapted to receive a module, such as a signal conditioning module. The chassis 122A also includes a low voltage analog bus 222 (not shown in FIG. 5) comprised in the chassis 122A and adapted for transmitting electrical signals. The chassis 122A also includes a plurality of low voltage connectors (e.g., SCXI connectors) 232 (not shown in FIG. 5) positioned in the chassis 122A and electrically coupled to the low voltage analog bus 222. The plurality of connectors 232 are adapted to connect at least one module to the low voltage analog bus backplane 222.

Unlike the chassis 122 shown in FIG. 2, the chassis 122A in FIG. 5 does not include a high voltage analog bus comprised in or built into the chassis 122A. In this embodiment, the chassis 122A includes only a low voltage analog bus 122 and low voltage connectors 232, such as SCXI bus and SCXI connectors, and the chassis 122A does not include the high voltage analog bus 224 or the high voltage connectors 234 shown in FIG. 2.

As shown, one or more modules 124 may be inserted into respective slots. One or more rear connectors 302 according to the present invention may connect to one or more of the modules 124. The one or more rear connectors 302 form a high voltage analog bus 224 for transmitting high voltage electrical signals between the one or more modules 124. As shown, an external instrumentation device 104, instead of connecting to a module 124, may instead connect to one of the rear connectors 302 through cables 312 and 314. Cable 312 is used to transmit digital control signals, and cable 314 is used to transmit high voltage analog bus signals.

FIG. 6 illustrates an embodiment of the signal conditioning system of FIG. 5, including a plurality of rear connectors 302 used to create the high voltage analog bus 224. In the embodiment of FIG. 6, the signal conditioning system 108A includes three rear connectors 302. The three rear connectors 302 comprise a 2 connector rear connector 302A and two 1 connector rear connectors 302B. In the preferred embodiment, the rear connectors 302 may have 1, 2, or 8 connectors. The rear connectors 302A and 302B are themselves electrically connected by connector devices 322, as shown, thus forming the high voltage analog bus 224. As shown, one of the external connectors 405 on the back of a rear connector 302 is not used by connector devices 322, and hence may be used to connect one or more external instruments to the external connector 405 and hence to the high voltage analog bus 224.

Figure 7:
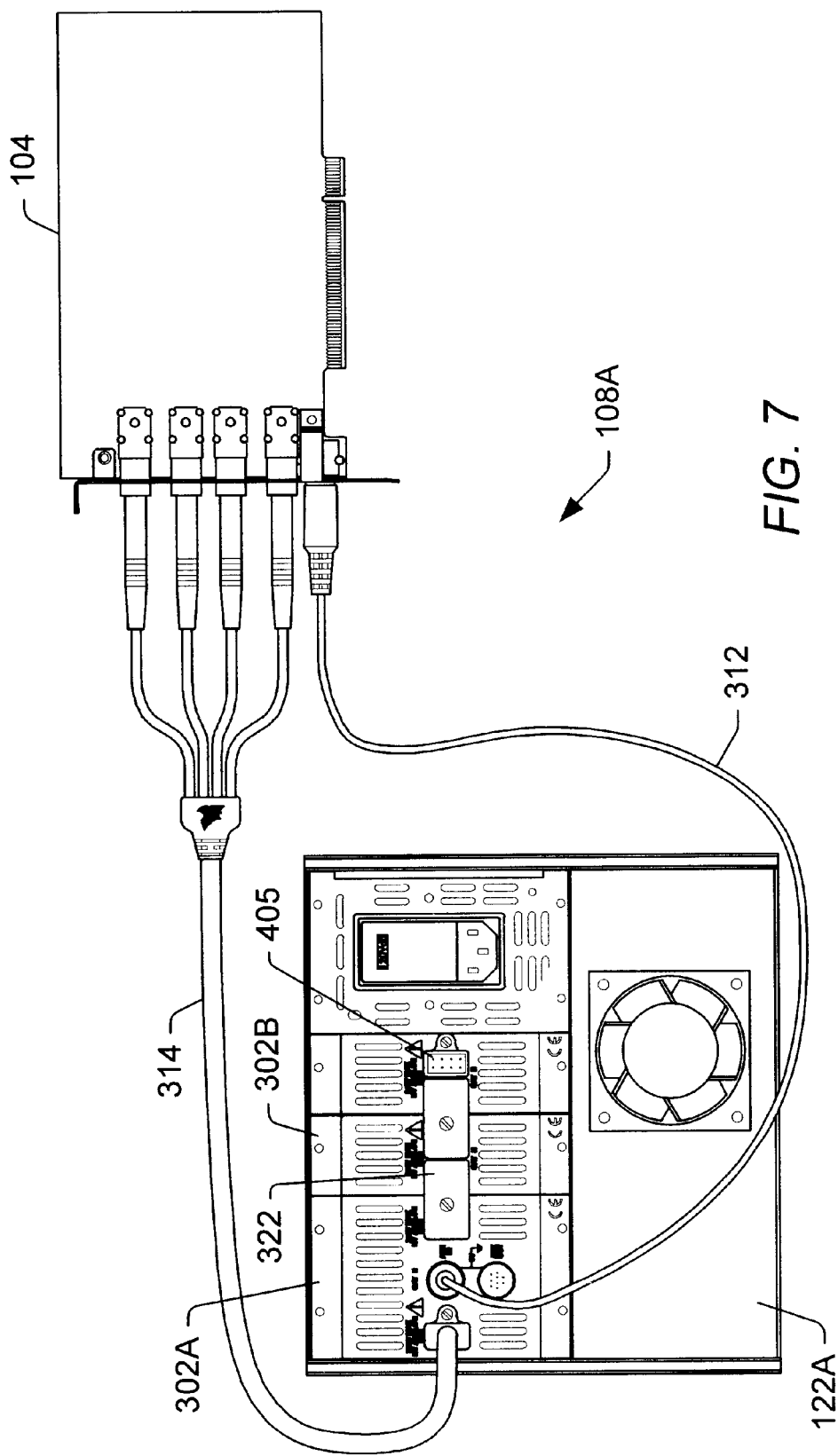
FIG. 7 illustrates the back of the signal conditioning system of FIG. 5.

FIG. 7 illustrates the back of the signal conditioning system 108A of FIG. 5. As shown, the connector devices 322 are used to electrically connect the rear connectors 302A and 302B. Also, as noted above, one of the external connectors 405 on the back of a rear connector 302 is not used by connector devices 322, and hence may be used to connect an external instrument to the high voltage analog bus 224.

Figure 8:
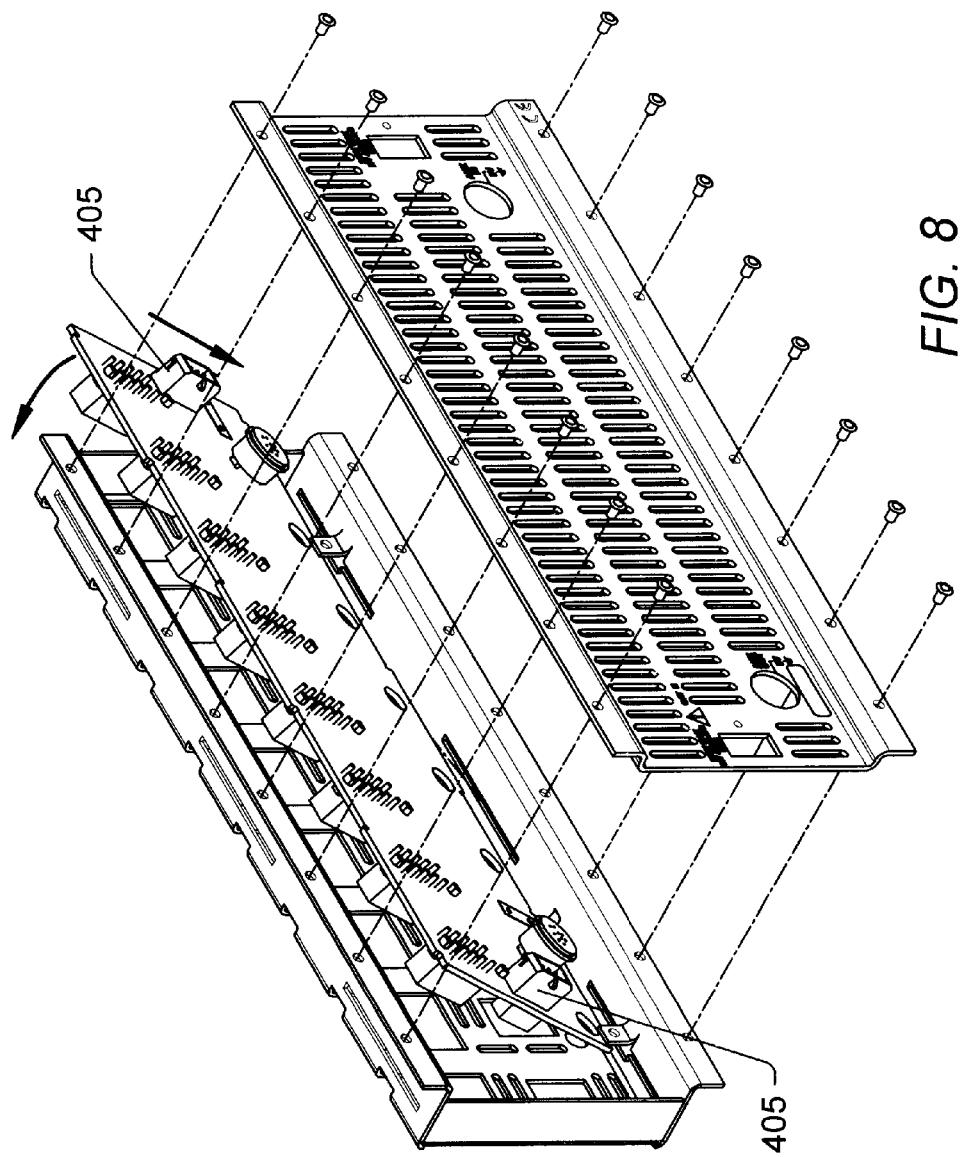
FIG. 8 is an exploded view of a rear connector having 8 connectors.

FIG. 8 is an exploded view of a rear connector 302 having 8 connectors 232. The rear connector 302 also includes the high voltage analog bus 224. Thus 8 modules 124 may connect to this rear connector in chassis 122A. As shown, the rear connector 302 includes two external connectors 405 which are connected to the high voltage analog bus 224. The two external connectors 405 may be used for daisy chaining additional rear connectors 302, or for connecting an external device, e.g., an instrument device, to the high voltage analog bus 224.

Figure 9:
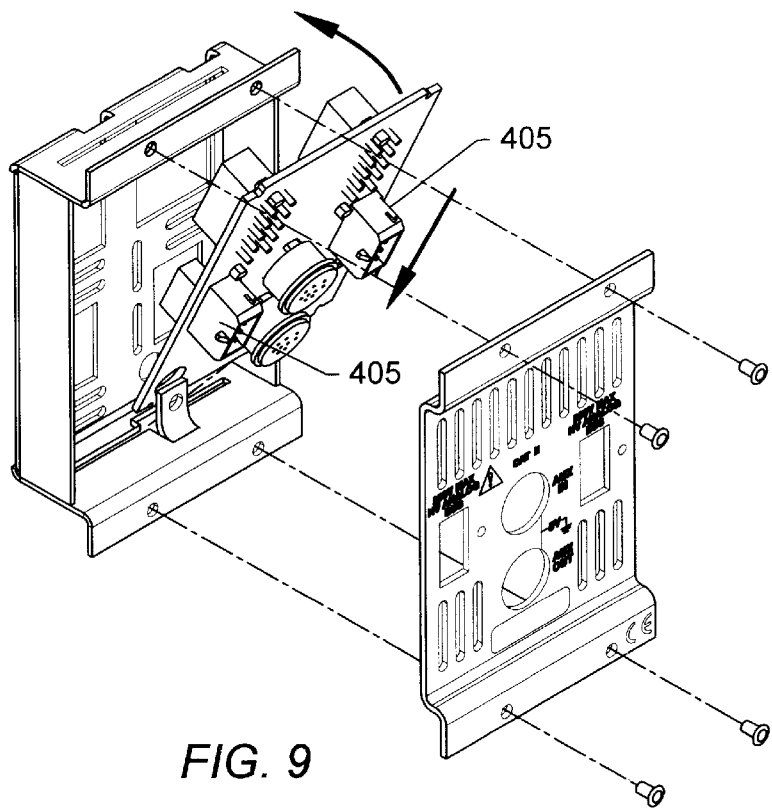
FIG. 9 is an exploded view of a rear connector having 2 connectors.
Figure 10:
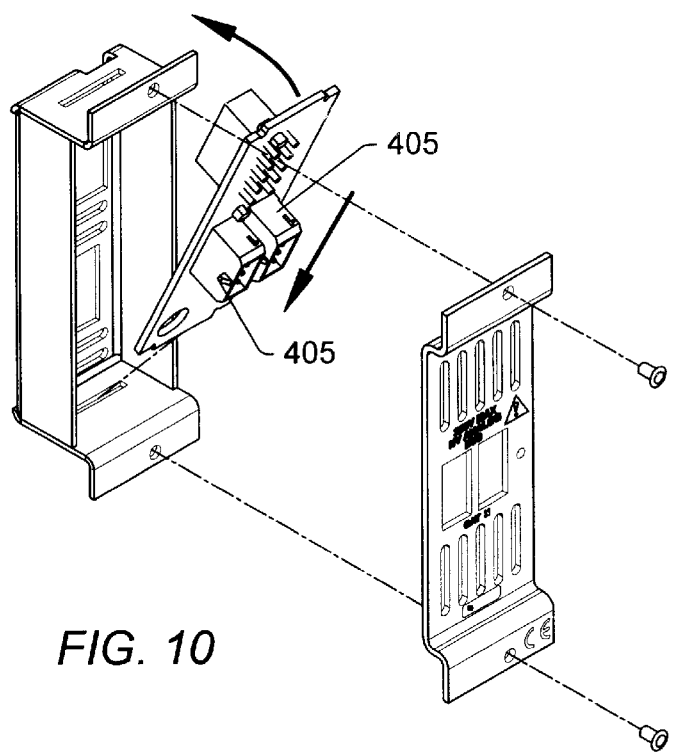
FIG. 10 is an exploded view of a rear connector having 1 connector.

FIG. 9 is an exploded view of a rear connector 302A having 2 connectors. As shown, rear connector 302A also has two external connectors 405. FIG. 10 is an exploded view of a rear connector 302B having 1 connector. As shown, rear connector 302B also has two external connectors 405. These different rear connector embodiments may provide greater modularity in configuration of the high voltage analog bus 224.

Numerous variations and modifications will become apparent to those skilled in the art once the above disclosure is fully appreciated. It is intended that the following claims be interpreted to embrace all such variations and modifications.

What is claimed is:

1. A signal conditioning system, comprising:
    a chassis, wherein said chassis is configured to define a plurality of slots, wherein each of said slots is adapted to receive a module;
    a low voltage analog bus comprised in said chassis and adapted for transmitting electrical signals;
    a high voltage analog bus comprised in said chassis and adapted for transmitting high voltage electrical signals;
    a plurality of connectors positioned in said chassis and electrically coupled to one or more of the low voltage analog bus and the high voltage analog bus, wherein each connector is adapted to connect a module to one or more of the low voltage analog bus and the high voltage analog bus.

2. The signal conditioning system of claim 1, wherein the low voltage analog bus includes one or more analog channels.

3. The signal conditioning system of claim 1, wherein the low voltage analog bus is the SCXI backplane.

4. The signal conditioning system of claim 1, further comprising:
    at least one module comprised in a slot of the chassis, wherein the at least one module connects to one or more of the low voltage analog bus and the high voltage analog bus.

5. The signal conditioning system of claim 1,
    wherein the plurality of connectors include a plurality of low voltage connectors which are each adapted to connect a module to the low voltage analog bus and a plurality of high voltage connectors which are each adapted to connect a module to the high voltage analog bus.

6. The signal conditioning system of claim 5, further comprising:
    at least one module comprised in a slot of the chassis, wherein the at least one module connects to one of the connectors, wherein the at least one module connects to one or more of the low voltage analog bus and the high voltage analog bus.

7. The signal conditioning system of claim 5, further comprising:
    a safety switch which is software programmable to connect the at least one module to either the low voltage analog bus or the high voltage analog bus.

8. The signal conditioning system of claim 5, further comprising:
    a low voltage module comprised in a slot of the chassis, wherein the low voltage module connects to a low voltage connector, wherein the low voltage module connects through the low voltage connector to the low voltage analog bus.

9. The signal conditioning system of claim 5, further comprising:
    a high voltage module comprised in a slot of the chassis, wherein the high voltage module connects to a high voltage connector, wherein the high voltage module connects through the high voltage connector to the high voltage analog bus.

10. The signal conditioning system of claim 5, further comprising:
a low voltage module comprised in a first slot of the chassis, wherein the low voltage module connects to a low voltage connector, wherein the low voltage module connects through the low voltage connector to the low voltage analog bus; and
a high voltage module comprised in a second slot of the chassis, wherein the high voltage module connects to a high voltage connector, wherein the high voltage module connects through the high voltage connector to the high voltage analog bus.

11. The signal conditioning system of claim 1, wherein said slots are adapted to receive signal conditioning modules and switching modules.

12. The signal conditioning system of claim 1, further comprising:
at least one signal conditioning module comprised in a slot of the chassis, wherein the at least one signal conditioning module connects to one of the connectors, wherein the at least one signal conditioning module connects to one or more of the low voltage analog bus and the high voltage analog bus.

13. The signal conditioning system of claim 1, further comprising:
at least one switching module comprised in a slot of the chassis, wherein the at least one switching module connects to one of the connectors, wherein the at least one switching module connects to one or more of the low voltage analog bus and the high voltage analog bus.

14. The signal conditioning system of claim 1, wherein said slots are adapted to receive instrument modules.

15. The signal conditioning system of claim 1, further comprising:
at least one instrument module comprised in a slot of the chassis, wherein the at least one instrument module connects to one of the connectors, wherein the at least one instrument module connects to one or more of the low voltage analog bus and the high voltage analog bus.

16. The signal conditioning system of claim 1, wherein a first slot of the chassis includes only a low voltage connector for connecting a module to only the low voltage analog bus;
wherein a second slot of the chassis includes only a high voltage connector for connecting a module to only the high voltage analog bus.

17. The signal conditioning system of claim 1, further comprising:
an external connector comprised on the chassis which is electrically connected to one or more of the low voltage analog bus and the high voltage analog bus;
wherein the external connector is adapted to connect to an external instrument.

18. The signal conditioning system of claim 1, further comprising:
an external connector comprised on the chassis which is electrically connected to the high voltage analog bus;
wherein the external connector is adapted to connect to an external instrument.

19. The signal conditioning system of claim 1, further comprising:
at least one module comprised in a slot of the chassis, wherein the at least one module connects to one of the connectors, wherein the at least one module connects to one or more of the low voltage analog bus and the high voltage analog bus;
wherein the at least one module includes an instrument connector, wherein the instrument connector is adapted to connect an external instrument through the at least one module to one or more of the low voltage analog bus and the high voltage analog bus.

20. The signal conditioning system of claim 1, further comprising:
a module comprised in a slot of the chassis;
an external connector comprised on the chassis which is electrically connected to the high voltage analog bus;
wherein the module connects to the external connector, thereby enabling the module to connect to one or more of the low voltage analog bus and the high voltage analog bus.

21. The signal conditioning system of claim 1, wherein the high voltage electrical signals comprise signals having voltages greater than 30 volts rms and 42.4 volts peak.

* * * * *